US008737560B2

(12) United States Patent
Tan et al.

(10) Patent No.: US 8,737,560 B2
(45) Date of Patent: May 27, 2014

(54) SHIFT REGISTER UNIT, GATE DRIVING DEVICE AND LIQUID CRYSTAL DISPLAY

(75) Inventors: Wen Tan, Beijing (CN); Xiaojing Qi, Beijing (CN); Haigang Qing, Beijing (CN)

(73) Assignees: Boe Technology Group Co., Ltd., Beijing (CN); Chengdu Boe Optoelectronics Technology Co., Ltd., Chengdu, Sichuan Province (CN)

( * ) Notice: Subject to any disclaimer, the term of this patent is extended or adjusted under 35 U.S.C. 154(b) by 229 days.

(21) Appl. No.: 13/283,718

(22) Filed: Oct. 28, 2011

(65) Prior Publication Data

US 2012/0105393 A1 May 3, 2012

(30) Foreign Application Priority Data

Oct. 29, 2010 (CN) .......................... 2010 1 0532031

(51) Int. Cl.
*G11C 19/00* (2006.01)

(52) U.S. Cl.
USPC .................... 377/64; 377/69; 377/78; 377/79

(58) Field of Classification Search
None
See application file for complete search history.

(56) References Cited

U.S. PATENT DOCUMENTS

2007/0171115 A1 7/2007 Kim et al.
2010/0188385 A1 7/2010 Boiko
2011/0007863 A1* 1/2011 Tsai et al. ........................ 377/79
2011/0059640 A1* 3/2011 Su et al. ......................... 439/320
2012/0105397 A1* 5/2012 Tan et al. ........................ 345/205
2012/0113088 A1* 5/2012 Han et al. ........................ 345/212
2012/0262438 A1* 10/2012 Shang et al. .................. 345/211

FOREIGN PATENT DOCUMENTS

CN 101546607 A 9/2009
CN 101765876 A 6/2010
EP 1 445 862 A2 8/2004
JP 2004-078172 A 3/2004
JP 2008-217902 A 9/2008
KR 2007-74826 A 7/2007

OTHER PUBLICATIONS

Chinese First Office Action dated Jan. 31, 2013; Appln No. 2010105320313.

* cited by examiner

*Primary Examiner* — Tuan T Lam
(74) *Attorney, Agent, or Firm* — Ladas & Parry LLP

(57) ABSTRACT

The present invention provides a shift register unit, a gate driving device and a liquid crystal display, wherein the shift register unit includes a first thin film transistor, a second thin film transistor, a third thin film transistor and a fourth thin film transistor, and further includes a pull-down unit and a driving unit. Since the shift register unit includes the pull-down unit and the driving unit, it is possible to assure that the output gate driving signal keeps at a low level stably when the shift register unit needs to output a low level, and the pull-down unit operates under the driving of an alternating current signal, which can prevent the threshold voltage of the thin film transistor of the pull-down unit from offsetting largely.

5 Claims, 4 Drawing Sheets

SHIFT REGISTER UNIT, GATE DRIVING DEVICE AND LIQUID CRYSTAL DISPLAY

FIELD OF THE INVENTION

Embodiments of the present invention relate to the field of driving technology, especially to a shift register unit, a gate driving device and a liquid crystal display.

BACKGROUND OF THE INVENTION

In Thin Film Transistor Liquid Crystal Display (TFT-LCD for short), usually, gates of respective thin film transistors (TFT) of a pixel area are provided with a gate driving signal via a gate driving device. The gate driving device may be formed on the array substrate of a liquid crystal display (LCD) by an array process, and such technology is also referred to as Gate on Array (GOA for short) technology.

A LCD gate driving device formed by using the GOA technology includes multiple shift register units each of which includes multiple TFTs. The shift register units are connected to the gate lines of a pixel area which means the display area of a LCD and includes multiple sub-pixels. When a certain row of gate lines needs to be turned on, the shift register unit connected thereto outputs a gate driving signal of high level. When the row of gate lines needs not to be turned on, the shift register units connected thereto outputs a gate driving signals of low level.

However, in many cases, the signal output by the shift register unit may be disturbed by an input clock signal, and a signal of high level is output at the time when there is no need to output such signal of high level. Therefore, a problem to be solved is how to enable a shift register unit to keep at a low level reliably when needed.

SUMMARY OF THE INVENTION

The present invention provides a shift register unit, a gate driving device and a liquid crystal display for solving the problem in the prior art that a shift register unit fails to keep at a low level reliably when needed to keep at a low level.

The embodiment of the present invention provides a shift register unit, comprising:

a first thin film transistor, the drain of which is connected to a first clock signal input terminal and the source of which is connected to a gate driving signal output terminal;

a second thin film transistor, the drain of which is connected to the gate driving signal output terminal, the gate of which is connected to a reset signal input terminal, and the source of which is connected to a low level signal input terminal;

a third thin film transistor, the drain and gate of which are connected to a start signal input terminal and the source of which is connected to the gate of the first thin film transistor;

a fourth thin film transistor, the drain of which is connected to the source of the third thin film transistor, the gate of which is connected to the reset signal input terminal, and the source of which is connected to the low level signal input terminal;

a capacitor, two terminals of which are connected to the gate and the source of the first thin film transistor respectively;

a pull-down unit for pulling a signal output by the gate driving signal output terminal down to a low level when the gate driving signal output terminal is needed to output a low level signal; and a driving unit for generating an alternating current driving signal for driving the pull-down unit when the gate driving signal output terminal is needed to output the low level signal.

The embodiment of the present invention further provides a liquid crystal display gate driving device, comprising n shift register units sequentially connected as described above, wherein n is a natural number;

except for the first shift register unit and the n-th shift register unit, the gate driving signal output terminal of each shift register unit is connected to the reset signal input terminal of the last neighboring shift register unit and the start signal input terminal of the next neighboring shift register unit;

the gate driving signal output terminal of the first shift register unit is connected to the start signal input terminal of the second shift register unit; and the gate driving signal output terminal of the final shift register unit is connected to the reset signal input terminal of the (n−1)-th shift register unit and the reset signal input terminal of itself.

The embodiment of the present invention further provides a liquid crystal display comprising the liquid crystal display gate driving device as described above.

In the shift register unit, the gate driving device and the liquid crystal display provided by the embodiment of the present invention, the shift register unit includes the pull-down unit and the driving unit. The pull-down unit pulls a signal output by the gate driving signal output terminal down to a low level when the gate driving signal output terminal is needed to output a low level signal, so that it is possible to assure that the output gate driving signal stably keeps at a low level when the shift register unit needs to output the low level. Furthermore, the driving unit generates the alternating current driving signal for driving the pull-down unit when the gate driving signal output terminal is needed to output a low level, so that the pull-down unit operates under the driving of one alternating current signal, which can prevent the threshold voltage of the thin film transistor of the pull-down unit from offsetting largely.

BRIEF DESCRIPTION OF THE DRAWINGS

In order to illustrate embodiments of the present invention or technical solutions in the prior art more clearly, a brief introduction will be made to attached drawings needed to be used in the description of the embodiments or the prior art in the following. Obviously, the attached drawings in the following description are only some embodiments of the present invention, and for those of ordinary skill in the art, other attached drawings may be obtained according to these attached drawings without inventive efforts.

DESCRIPTION OF THE PREFERRED EMBODIMENTS

In order to make the object, technical solutions and advantages of embodiments of the present invention more clear, the technical solutions in the embodiments of the present invention will be described clearly and thoroughly in combination with the attached drawings in the embodiments of the present invention. Obviously, the described embodiments are only a part of embodiments of the present invention and are not all of the embodiments. Based on the embodiments of the present invention, all of other embodiments obtained by those of ordinary skill in the art without inventive efforts belong to the protection scope of the present invention.

Figure 1:
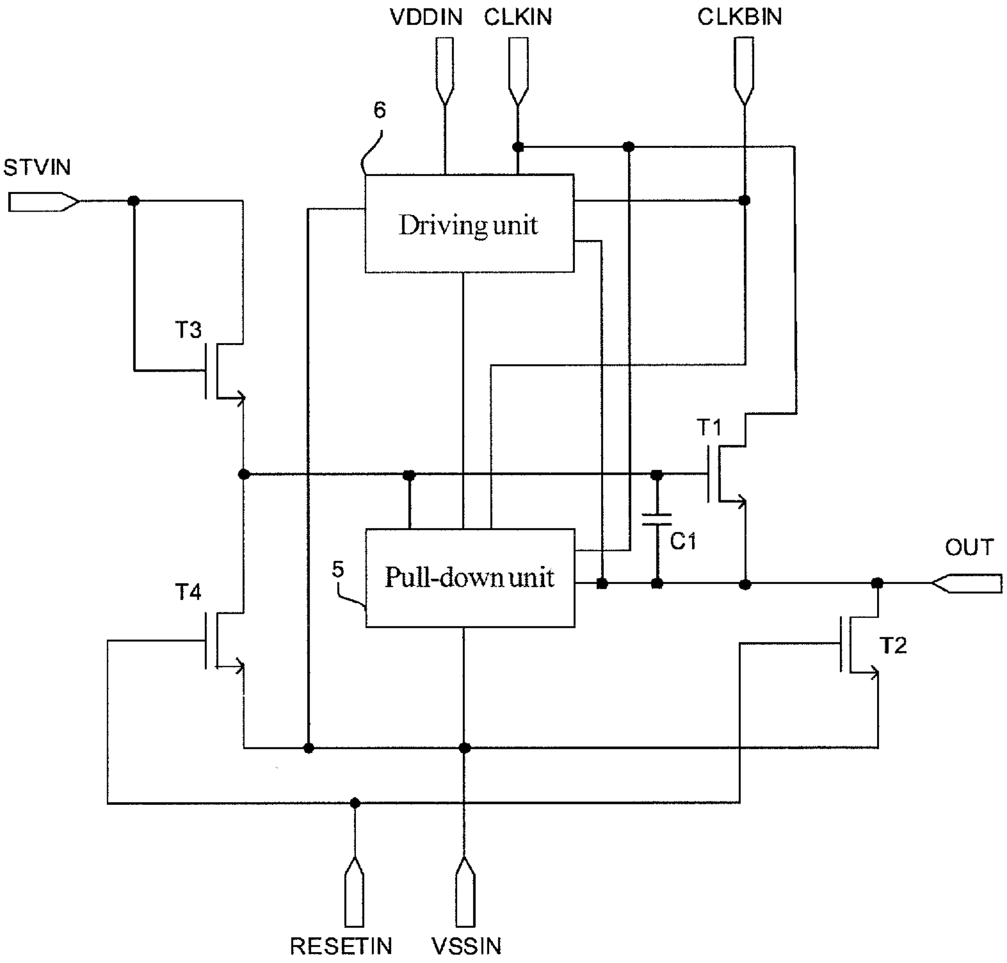
FIG. 1 is a structural schematic diagram for a first embodiment of a shift register unit of the present invention.

FIG. 1 is a structural schematic diagram for a first embodiment of a shift register unit of the present invention. The shift register unit includes a first TFT T1, a second TFT T2, a third TFT T3, a fourth TFT T4, a capacitor C1, a pull-down unit 5 and a driving unit 6.

The drain of the first TFT T1 is connected to a first clock signal input terminal (CLKIN), and the source thereof is connected to a gate driving signal output terminal (OUT).

The drain of the second TFT T2 is connected to the gate driving signal output terminal (OUT), the gate thereof is connected to a reset signal input terminal (RESETIN), and the source thereof is connected to a low level signal input terminal (VSSIN).

The drain and gate of the third TFT T3 are connected to a start signal input terminal (STVIN), and the source thereof is connected to the gate of the first TFT.

The drain of the fourth TFT T4 is connected to the source of the third TFT T3, the gate thereof is connected to the reset signal input terminal (RESETIN), and the source thereof is connected to the low level signal input terminal (VSSIN).

The two terminals of the capacitor C1 are connected to the gate and the source of the first TFT T1 respectively.

The pull-down unit 5 is connected to the source of the third TFT T3, the low level signal input terminal (VSSIN), the source of the first TFT T1, the first clock signal input terminal (CLKIN), a second clock signal input terminal (CLKBIN) and the gate driving signal output terminal (OUT) respectively, for pulling the signal output from the gate driving signal output terminal (OUT) down to a low level when the gate driving signal output terminal (OUT) is needed to output a signal of low level.

The driving unit 6 is connected to the first clock signal input terminal (CLKIN), the second clock signal input terminal (CLKBIN), the low level signal input terminal (VSSIN), a high level signal input terminal (VDDIN), the gate driving signal output terminal (OUT) and the pull-down unit 5, for generating an alternating current driving signal for driving the pull-down unit 5 when the gate driving signal output terminal (OUT) is needed to output a signal of low level.

Wherein, the first clock signal input terminal (CLKIN) is used to input a clock signal. The second clock signal input terminal (CLKBIN) is used to input a clock signal inverted with respect to the signal input by the first clock signal input terminal. The reset signal input terminal (RESETIN) is used to input a reset signal. The start signal input terminal (STVIN) is used to input a start signal. The low level signal input terminal (VSSIN) is used to input a signal of low level. The high level signal input terminal is used to input a signal of high level. The gate driving signal output terminal (OUT) is used to output a gate driving signal.

Wherein, the driving unit 6 may include at least one TFT which is turned on when the gate driving signal output terminal (OUT) is needed to output a signal of a low level, and the drain of which may generate an alternating current driving signal to drive the pull-down unit 5 to operate so as to pull the signal output by the gate driving signal output terminal (OUT) down to a low level. The waveform of the generated alternating current driving signal may be similar with that of the clock signal input by the first clock signal input terminal (CLKIN).

The pull-down unit 5 may include at least one TFT which is turned on under the function of the alternating current driving signal generated by the driving unit 6 and the source of which is connected to the low level signal input terminal (VSSIN) so that the TFT may function so as to pull the signal output by the gate driving signal output terminal (OUT) down to a low level. When the number of TFTs included in the pull-down unit 5 is plural, it is able to pull the signal output by the gate driving signal output terminal (OUT) down to a low level more reliably.

For a LCD, when it is needed to control a row of gate lines to be turned on, the gate driving signals output by the shift register units connected to the row of gate lines are at high levels; when it is needed to control the row of gate lines to be turned off, the gate driving signals output by the shift register units connected to the row of gate lines are at low levels. If the LCD adopts a manner of line-by-line scanning and, it is assumed that there are “a” rows of gate lines, the display time for one frame of the LCD is T, then the time when the gate driving signal keeps at a high level is T/a.

However, the gate driving signal output by a first signal output terminal may also change to a high level at the stage of being needed to keep at a low level, due to the influence of the clock signal, thereby influencing the normal display of the LCD. Taking FIG. 1 as an example, the drain of the first TFT T1 is connected to the first clock signal input terminal (CLKIN), and the signal input by the first clock signal input terminal may still change to a high level at the stage of the gate driving signal being needed to keep at a low level, and the signal input by the first clock signal input terminal changing to a high level possibly results in the gate driving signal changing to a high level as well. Although the second TFT T2 may function so as to pull the level of the gate driving signal down, the second TFT plays a role of pulling the level down only when the signal input by the reset signal input terminal (RESETIN) is at a high level, and when the second TFT T2 is turned off, it fails to assure that the gate driving signal reliably keeps at a low level.

The shift register unit provided by the first embodiment of the present invention includes a pull-down unit and a driving unit, wherein the pull-down unit pull the signal output by the gate driving signal output terminal down to a low level when the gate driving signal is needed to output a signal of low level, so that it can be assured that the output gate driving signal stably keeps at a low level when the shift register unit needs to output a low level. Furthermore, the driving unit generates an alternating current driving signal for driving the pull-down unit when the gate driving signal output terminal is needed to output a low level, so that the pull-down unit operates under the driving of one alternating current signal, thus the threshold voltage of the TFT of the pull-down unit may be prevented from offsetting largely.

Figure 2:
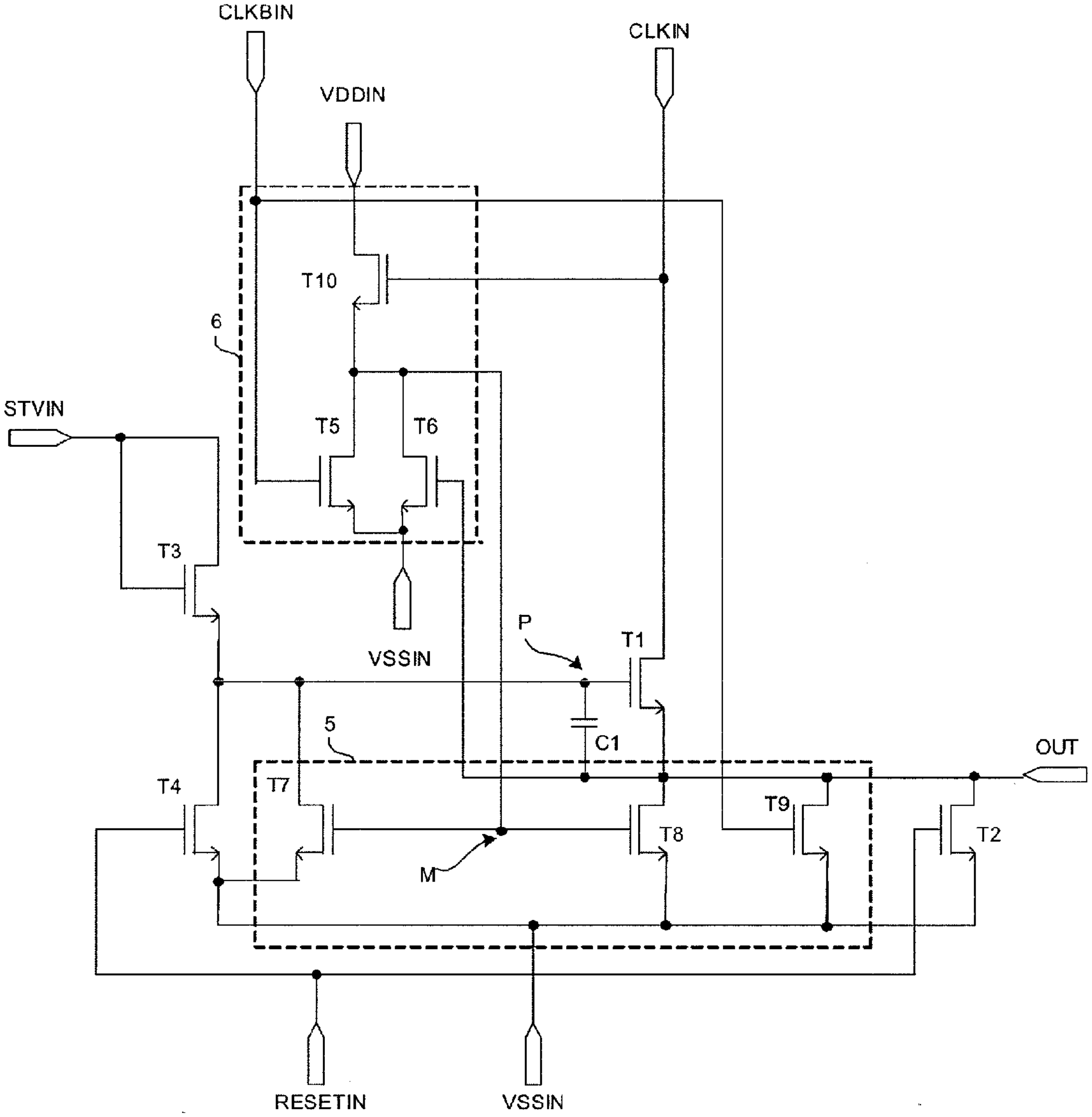
FIG. 2 is a structural schematic diagram for a second embodiment of a shift register unit of the present invention.

FIG. 2 is a structural schematic diagram for a second embodiment of a shift register unit of the present invention. In the embodiment, the driving unit 6 includes a tenth TFT T10, a fifth TFT T5 and a sixth TFT T6.

The drain of the tenth TFT T10 is connected to the high level signal input terminal (VDDIN), the gate thereof is connected to the first clock signal input terminal (CLKIN). The drain of the fifth TFT T5 is connected to the source of the tenth TFT T10, the gate thereof is connected to the second clock signal input terminal (CLKBIN), and the source thereof is connected to the low level signal input terminal (VSSIN). The drain of the sixth TFT T6 is connected to the source of the tenth TFT T10, the gate thereof is connected to the gate driving signal output terminal (OUT), and the source thereof is connected to the low level signal input terminal (VSSIN).

The pull-down unit 5 includes a seventh TFT T7, an eighth TFT T8 and a ninth TFT T9. The drain of the seventh TFT T7 is connected to the source of the third TFT T3, the gate thereof is connected to the source of the tenth TFT T10, and the source thereof is connected to the low level signal input terminal (VSSIN). The drain of the eighth TFT T8 is connected to the source of the first TFT T1, the gate thereof is connected to the source of the tenth TFT T10, and the source thereof is connected to the low level signal input terminal (VSSIN). The drain of the ninth TFT T9 is connected to the gate driving signal output terminal (OUT), the gate thereof is connected to the second clock signal input terminal (CLKBIN), and the source thereof is connected to the low level signal input terminal (VSSIN).

Figure 3:
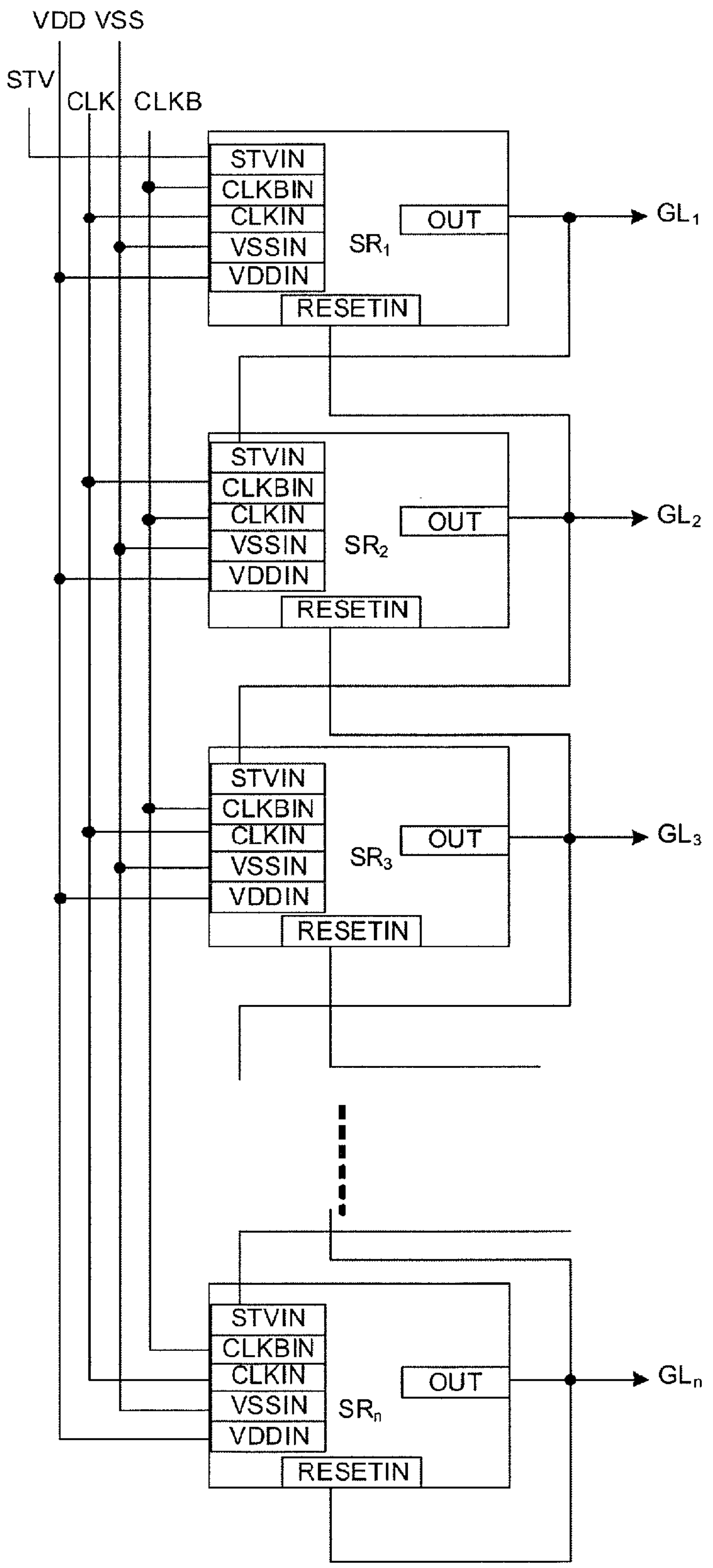
FIG. 3 is a structural schematic diagram for a LCD gate driving device of the present invention.

FIG. 3 is a structural schematic diagram for a LCD gate driving device of the present invention, wherein the device includes n shift register units sequentially connected as shown in the respective embodiments as described above in which n is a natural number. Respective shift register units are marked with $SR_1$, $SR_2$, . . . , $SR_n$ respectively.

Except for the first shift register unit $SR_1$ and the n-th shift register unit $SR_n$, the gate driving signal output terminal (OUT) of each shift register unit is connected to the reset signal input terminal (RESETIN) of the last neighboring shift register unit and the start signal input terminal (STVIN) of the next neighboring shift register unit.

The gate driving signal output terminal (OUT) of the first shift register unit $SR_n$ is connected to the start signal input terminal (STVIN) of the second shift register unit.

The gate driving signal output terminal (OUT) of the final shift register unit $SR_1$ is connected to the reset signal input terminal (RESETIN) of the (n−1)-th shift register unit and the reset signal input terminal (RESETIN) of itself.

The gate driving signals outputs by respective shift register units are marked with $GL_1$, $GL_2$, . . . , $GL_n$ respectively.

The connection relationship of respective shift register units in the gate driving device provided by the present invention can be seen clearly in combination with FIG. 3 and respective embodiments for shift register units as described above. In the following, the timing relationship between the input and output signals in a single shift register unit as well as the timing relationship between the input and output signals in a LCD gate driving device are introduced.

Figure 4:
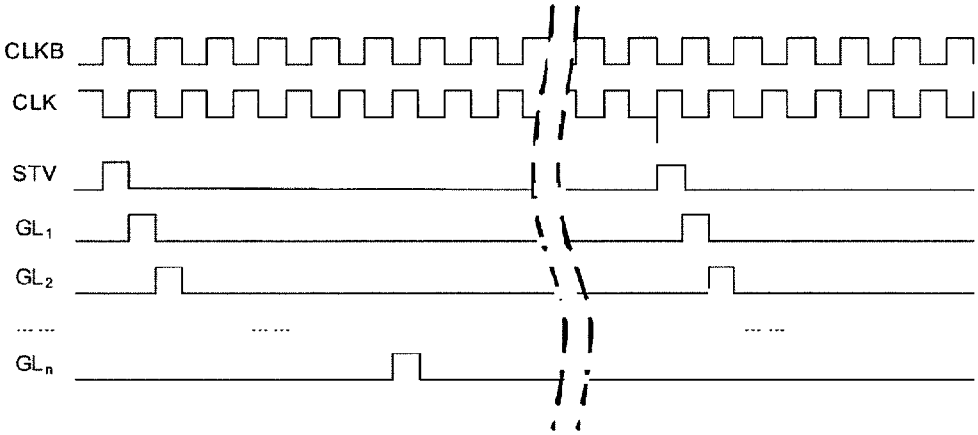
FIG. 4 is a timing chart for input and output signals of the LCD gate driving device shown in FIG. 3.

FIG. 4 is a timing chart for the input and output signals of the LCD gate driving device shown in FIG. 3. STV is a frame start signal which is input to the start signal input terminal (STVIN) of the first shift register unit $SR_I$, and the start signal input terminals (STVINs) of the rest shift register units are all connected to the gate driving signal output terminals (OUTs) of the last neighboring shift register units, that is, the input to the start signal input terminals (STVINs) of the rest shift register units are the signals output by the gate driving signal output terminals (OUTs) of the last neighboring shift register units. The gate driving signal output terminal (OUT) of each shift register unit outputs one gate driving signal for driving one row of gate lines of the LCD.

A low level signal (VSS) and a high level signal (VDD) (VSS and VDD are not shown in FIG. 4) are input to the low level signal input terminal (VSSIN) and the high level signal input terminal (VDDIN) of each shift register unit, respectively.

For the odd numbered shift register unit, the first clock signal input terminal (CLKIN) thereof is used to input a first clock signal (CLK), and the second clock signal input terminal (CLKBIN) thereof is used to input a second clock signal (CLKB). For the even numbered shift register unit, the first clock signal input terminal (CLKIN) thereof is used to input the second clock signal (CLKB), and the second clock signal input terminal (CLKBIN) thereof is used to input the first clock signal (CLK), wherein the first clock signal (CLK) and the second clock signal (CLKB) are inverted signals with each other.

Figure 5:
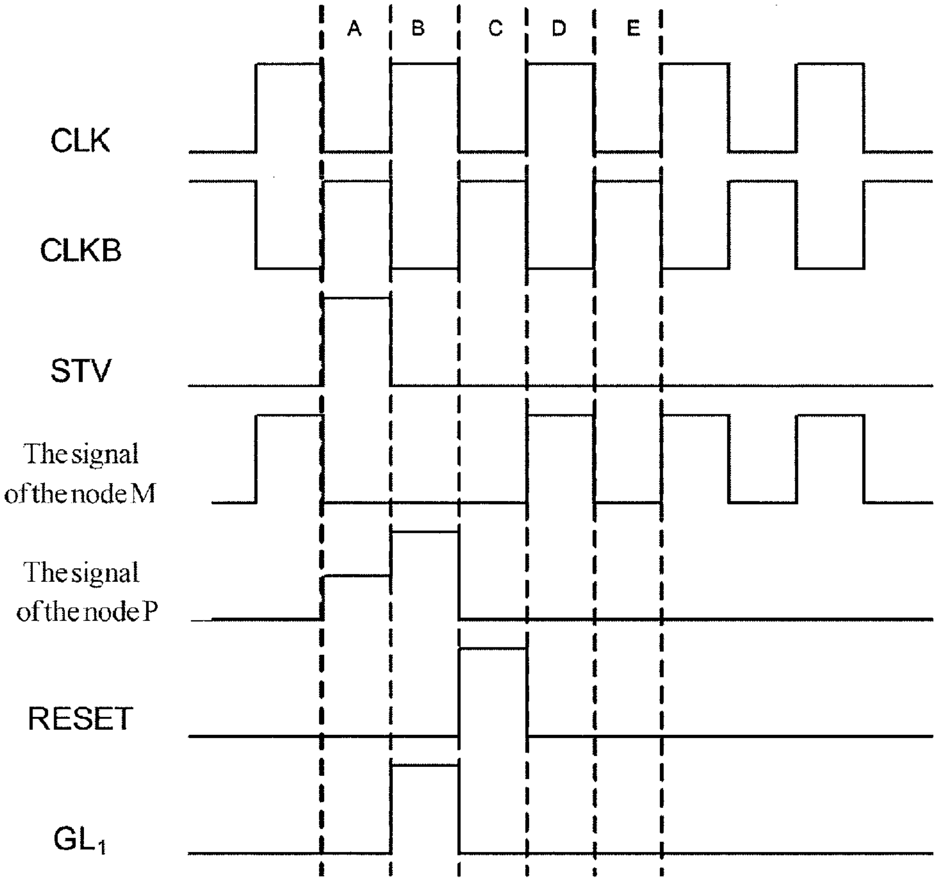
FIG. 5 is a timing chart for input and output of the shift register unit shown in FIG. 2.

FIG. 5 is a timing chart for the input and output of the shift register unit shown in FIG. 2. The start signal input terminal (STVIN) of the shift register unit shown in FIG. 2 inputs the frame start signal (STV), the first clock signal input terminal (CLKIN) inputs the first clock signal (CLK), the second clock signal input terminal (CLKBIN) inputs the second clock signal (CLKB), the low level signal input terminal (VSSIN) inputs the low level signal (VSS), the reset signal input terminal (RESETIN) inputs a reset signal (RESET), and the gate driving signal output terminal (OUT) outputs the gate driving signal ($GL_1$). The low level signal (VSS) and the high level signal (VDD) are not shown in FIG. 5. The high level signal (VDD) is a signal which keeps at a high level at all times.

In the shift register unit shown in FIG. 2, a node P is formed where the gate of the third TFT T3, the gate of the first TFT T1, one terminal of the capacitor C1, the drain of the seventh TFT T7 and the source of the third TFT T3 converge. A node M is formed where the gate of the eighth TFT T8, the gate of the seventh TFT T7, the drain of the fifth TFT T5 and the drain of the sixth TFT T6 converge. The timing at the node M along with timing at the node P is shown in FIG. 5.

In the following, the operation principle of the shift register unit provided by the present invention is illustrated in combination with FIG. 2, FIG. 3, FIG. 4 and FIG. 5. It is assumed that the shift register unit shown in FIG. 2 is the first shift register unit in the gate driving device as shown in FIG. 3.

A part of the timing chart shown in FIG. 5 is selected, and 5 stages are selected therefrom and marked with A, B, C, D and E respectively.

At the stage A, the second clock signal (CLKB) is at a high level, the ninth TFT T9 is turned on, and the fifth TFT T5 is turned on. The first clock signal (CLK) is at a low level, the fourth TFT T4 and the sixth TFT T6 are turned off, thus the level of the node M is pulled down to the low level, and the seventh TFT T7 and the eighth TFT T8 are turned off. The frame start signal (STV) is at the high level, the third TFT T3 operates in a saturation region, the level at the node P is pulled up to the high level, and the first TFT T1 is turned on. Since the ninth TFT T9 is turned on and the source of the ninth TFT T9 is connected to the low level signal input terminal (VSSIN), the signal ($GL_1$) output by the gate driving signal output terminal (OUT) is pulled down to the low level. The charging voltage of the two terminals of the capacitor C1 is the difference between a level value of the high level and a level value of the low level.

At the stage B, the reset signal (RESET) and the second clock signal (CLKB) are at the low level and the frame start signal (STV) is at the low level, thus the third TFT T3, the tenth TFT T10, the second TFT T2, the ninth TFT T9 and the fifth TFT T5 are turned off. Due to the charge retain function of the capacitor C1, the level of the node P still keeps at the high level and the first TFT T1 remains on. The first clock signal (CLK) is at the high level, and the tenth TFT T10 is turned on. Since the first TFT T1 remains on and the first clock signal (CLK) is at the high level, the signal ($GL_1$) output by the gate driving signal output terminal (OUT) is at the high level, the sixth TFT 16 is turned on, the node M keeps at the low level, and the seventh TFT T7 and the eighth TFT T8 are turned off.

In addition, at the stage B, due to the coupling function of the capacitor C1, the level of the node P is further pulled up to the difference between double of the level value of the high level and the level value of the low level, that is, the gate voltage of the first TFT T1 is increased and the on current of the first TFT T1 is increased, so that it is possible to make the gate driving signal ($GL_1$) output by the gate driving signal output terminal (OUT) become steep.

When the shift register unit is at the stage B, the next neighboring shift register unit is at the stage A, so that the signal ($GL_1$) output by the gate driving signal output terminal (OUT) may just function as the frame start signal for the next neighboring shift register unit.

At the stage C, the frame start signal (STV) is at the low level and the third TFT T3 is turned off. The second clock signal (CLKB) is at the high level, the ninth TFT 19 is turned on, and the fifth TFT T5 is turned on. The first clock signal (CLK) is at the low level, the tenth TFT T10 is turned off, the level of the node M is pulled down to the low level, and the seventh TFT T7 and the eighth TFT T8 are turned off. Since the ninth TFT T9 is turned on, the signal ($GL_1$) output by the gate driving signal output terminal (OUT) is at the low level.

In addition, at the stage C, the reset signal (RESET) is at the high level, the second TFT T2 and the fourth TFT T4 are turned on, and the level of the node P is pulled down to the low level. The second TFT T2 being turned on further assures that the signal ($GL_1$) output by the gate driving signal output terminal (OUT) is reliably pulled down to the low level. Since the gate driving signal output terminal (OUT) is connected to gate lines on the array substrate and there is a relatively large parasitic capacitance, if the second TFT T2 is turned on, then the discharging of the parasitic capacitance may be speeded up, so that the signal ($GL_1$) output by the gate driving signal output terminal (OUT) is restored quickly to the low level.

At the stage D, the reset signal (RESET) is at the low level, and the second TFT T2 and the fourth TFT T4 are turned off. The second clock signal (CLKB) is at the low level, and the ninth TFT T9 and the fifth TFT T5 are turned off. The first clock signal (CLK) is at the high level, the fourth TFT T4 is turned on, the level of the node M is pulled up to the high level, the seventh TFT T7 and the eighth TFT T8 are turned on, and the node P and the signal ($GL_1$) output by the gate driving signal output terminal (OUT) are pulled down to the low level.

At the stage E, the first clock signal (CLK) is at the low level and the fourth TFT T4 is turned off. The second clock signal (CLKB) is at the high level, the ninth TFT T9 and the fifth TFT T5 are turned on, the level of the node M is pulled down to the low level since the fourth TFT T4 is turned off, and the seventh TFT T7 and the eighth TFT T8 are turned off. Since the ninth TFT T9 is turned on, the signal ($GL_1$) output by the gate driving signal output terminal (OUT) is at the low level. The frame start signal (STV) is at the low level, the third TFT T3 is turned off, and the node P keeps at the low level.

After the stage E, the frame start signal (STV) keeps at the low level, the input and output timing signals of the shift register unit repeat the timing signals of the stages D and E, and with the first clock signal (CLK) and the second clock signal (CLKB) changing to the high level alternatively, the seventh TFT T7 and the eighth TFT T8 pull the signal ($GL_1$) output by the gate driving signal output terminal (OUT) down to the low level alternatively.

When the next high level of the frame start signal (STV) comes, the shift register unit repeats the timings of the stages A-E.

At the stages A, B and C as described above, the shift register unit outputs one gate driving signal such that the gate line connected to the first signal output terminal of the shift register unit controls one row of TFTs to be turned on, and the data signal of the source driving circuit of the LCD is input to a pixel electrode to charge the pixel electrode.

It can be seen by the introduction of the operation principle as described above that, in FIG. 2, the seventh TFT T7 and the eighth TFT T8 mainly play roles of pulling the level of the gate driving signal $GL_1$ down, and that it can be assured that the gate driving signal keeps at a low level reliably at the stage that the gate driving signal is needed to keep at a low level.

In the shift register unit shown in FIG. 2, the seventh TFT T7 and the eighth TFT T8 are not always turned on, instead, with the first clock signal (CLK) and the second clock signal (CLKB) changing to the high level alternatively, the seventh TFT T7 and the eighth TFT T8 are turned on alternatively as well (see FIG. 5 in which the timings of CLKB and the node M change to the high level alternatively), so that the gates of the seventh TFT T7 and the eighth TFT T8 are under the function of one alternating current bias voltage other than the function of one direct current bias voltage, thereby the threshold voltages Vth of the seventh TFT T7 and the eighth TFT T8 are prevented from generating an excessively large offset.

In the embodiment as shown in FIG. 2, the aspect ratios of respective TFTs may be as follows.

The first TFT T1: 1800 micron/4.5 micron; the second TFT T2: 800 micron/4.5 micron; the third TFT T3: 100 micron/4.5 micron; the fourth TFT T4: 200 micron/4.5 micron; the fifth TFT T5: 200 micron/4.5 micron; the sixth TFT T6: 200 micron/4.5 micron; the seventh TFT T7: 300 micron/4.5 micron; the eighth TFT T8: 100 micron/4.5 micron; the ninth TFT T9: 100 micron/4.5 micron; and the tenth TFT T10: 50 micron/4.5 micron. Wherein, the aspect ratios of the first TFT T1, the second TFT T2, the seventh TFT T7, the eighth TFT T8 and the fourth TFT T4 may be adjusted larger depending on requirements so as to improve the driving abilities of these TFTs.

Wherein, the capacitance value of the capacitor C1 may be 0.3 Pico farad (pF).

The present invention also provides a LCD which may include the LCD gate driving devices of respective embodiments as described above. Respective TFTs in the LCD gate driving device may be deposited on the array substrate by using a production process similar with that of TFTs of the pixel area, and preferably may be deposited at the edge of the array substrate.

Finally, it should be noted that the above embodiments are only used to illustrate the technical solutions of the present invention but not limiting thereof. Although the detailed description is made to the present invention with reference to the above embodiments, those of ordinary skill in the art should understand that modification can be made to the technical solutions described in the respective embodiments as described above or equivalent replacement can be made to a part of technical features therein, and such modification or replacement do not make the essences of corresponding technical solutions depart from the spirit and the scope of the technical solutions of respective embodiments of the present invention.

What is claimed is:

1. A shift register unit, comprising:

a first thin film transistor, the drain of which is connected to a first clock signal input terminal and the source of which is connected to a gate driving signal output terminal;

a second thin film transistor, the drain of which is connected to the gate driving signal output terminal, the gate of which is connected to a reset signal input terminal, and the source of which is connected to a low level signal input terminal;

a third thin film transistor, the drain and gate of which are connected to a start signal input terminal and the source of which is connected to the gate of the first thin film transistor;

a fourth thin film transistor, the drain of which is connected to the source of the third thin film transistor, the gate of which is connected to the reset signal input terminal, and the source of which is connected to the low level signal input terminal;

a capacitor, two terminals of which are connected to the gate and the source of the first thin film transistor respectively;

a pull-down unit for pulling a signal output by the gate driving signal output terminal down to a low level when the gate driving signal output terminal is needed to output a low level signal; and a driving unit for generating an alternating current driving signal for driving the pull-down unit when the gate driving signal output terminal is needed to output the low level signal, and wherein the driving unit comprises:

a tenth thin film transistor, the drain of which is connected to a high level signal input terminal and the gate of which is connected to the first clock signal input terminal;

a fifth thin film transistor, the drain of which is connected to the source of the tenth thin film transistor, the gate of which is connected to a second clock signal input terminal, and the source of which is connected to the low level signal input terminal; and a sixth thin film transistor, the drain of which is connected to the source of the tenth thin film transistor, the gate of which is connected to the gate driving signal output terminal, and the source of which is connected to the low level signal input terminal.

2. The shift register unit according to claim 1, wherein the pull-down unit comprises:

a seventh thin film transistor, the drain of which is connected to the source of the third thin film transistor, the gate of which is connected to the source of the tenth thin film transistor, and the source of which is connected to the low level signal input terminal;

an eighth thin film transistor, the drain of which is connected to the source of the first thin film transistor, the gate of which is connected to the source of the tenth thin film transistor, and the source of which is connected to the low level signal input terminal; and a ninth thin film transistor, the drain of which is connected to the gate driving signal output terminal, the gate of which is connected to the second clock signal input terminal, and the source of which is connected to the low level signal input terminal.

3. A liquid crystal display gate driving device, comprising n shift register units sequentially connected according to claim 1, wherein n is a natural number;

except for the first shift register unit and the n-th shift register unit, the gate driving signal output terminal of each shift register unit is connected to the reset signal input terminal of the last neighboring shift register unit and the start signal input terminal of the next neighboring shift register unit;

the gate driving signal output terminal of the first shift register unit is connected to the start signal input terminal of the second shift register unit; and the gate driving signal output terminal of the final shift register unit is connected to the reset signal input terminal of the (n−1)-th shift register unit and the reset signal input terminal of itself.

4. The liquid crystal display gate driving device according to claim 3, wherein for an odd numbered shift register unit, the first clock signal input terminal thereof is used to input the first clock signal and the second clock signal input terminal thereof is used to input the second clock signal;

for an even numbered shift register unit, the first clock signal input terminal thereof is used to input the second clock signal and the second clock signal input terminal thereof is used to input the first clock signal; and the first clock signal and the second clock signal are inverted signals with each other.

5. A liquid crystal display, comprising the liquid crystal display gate driving device according to claim 3.

* * * * *